United States Patent [19]
Srivatsa

[11] Patent Number: 5,838,580
[45] Date of Patent: Nov. 17, 1998

[54] METHOD OF OPTIMIZING REPEATER PLACEMENT IN LONG LINES OF A COMPLEX INTEGRATED CIRCUIT

[75] Inventor: Chakra R. Srivatsa, San Jose, Calif.

[73] Assignee: Sun Microsystems, Inc., Palo Alto, Calif.

[21] Appl. No.: 667,908

[22] Filed: Jun. 20, 1996

[51] Int. Cl.[6] .................................................. G06F 17/50
[52] U.S. Cl. .......................................... 364/489; 364/491
[58] Field of Search .................................. 364/488, 489, 364/490, 491, 578

[56] References Cited

U.S. PATENT DOCUMENTS

| | | | |
|---|---|---|---|
| 4,270,029 | 5/1981 | Sato et al. | 375/214 |
| 4,317,216 | 2/1982 | Kaegebein | 455/16 |
| 4,598,399 | 7/1986 | Bath | 370/226 |
| 4,698,760 | 10/1987 | Lembach et al. | 364/490 |
| 4,826,275 | 5/1989 | Heinzman | 385/46 |
| 4,930,118 | 5/1990 | Sugihara | 370/227 |
| 5,097,232 | 3/1992 | Stopper | 333/104 |
| 5,111,060 | 5/1992 | Asada | 307/219 |
| 5,235,221 | 8/1993 | Douglas et al. | 307/465 |
| 5,237,514 | 8/1993 | Curtin | 364/490 |
| 5,260,611 | 11/1993 | Cliff et al. | 307/465 |
| 5,287,289 | 2/1994 | Kageyama et al. | 364/489 |
| 5,333,032 | 7/1994 | Matsumoto et al. | 364/489 |
| 5,345,393 | 9/1994 | Ueda | 364/489 |
| 5,355,029 | 10/1994 | Houghton et al. | 307/443 |
| 5,359,535 | 10/1994 | Djaja et al. | 364/489 |
| 5,396,435 | 3/1995 | Ginetti | 364/489 |
| 5,402,357 | 3/1995 | Schaefer et al. | 364/490 |
| 5,404,311 | 4/1995 | Isoda | 364/490 |
| 5,416,718 | 5/1995 | Yamazaki | 364/488 |
| 5,418,490 | 5/1995 | Kaegebein | 330/124 |
| 5,426,591 | 6/1995 | Ginetti et al. | 364/489 |
| 5,436,575 | 7/1995 | Pederson et al. | 326/40 |
| 5,461,576 | 10/1995 | Tsay et al. | 364/490 |
| 5,475,605 | 12/1995 | Lin | 364/488 |
| 5,477,474 | 12/1995 | Southgate et al. | 364/578 |
| 5,661,661 | 8/1997 | Gregory et al. | 364/489 |

FOREIGN PATENT DOCUMENTS 04-1349922  9/1990  Japan .......................................... 15/60

OTHER PUBLICATIONS

H.–C. Tang et al., "Power dissipation models and performance improvement techniques for CMOS inverters with RC line and tree interconnections," *IEEE*, pp. 437–443 (Dec. 1993).

Circuits, Interconnections, and Packaging for VLSI, H.B. Bakoglu, 1990, cover, copyright, and back pages, and pp. 112–115.

*Primary Examiner*—Emanuel Todd Voeltz
*Assistant Examiner*—Leigh Marie Garbowski
*Attorney, Agent, or Firm*—Forrest Gunnison

[57] ABSTRACT

A method includes operating a general purpose computer system to minimize signal-propagation delay time of a long line of a simulated circuit. A design engineer empirically derives two rule bases, the first of which determines whether to divide the long line into two or more segments by inserting repeater amplifiers into a long line to minimize the propagation delay through the line. The second rule base relates optimum amplifier size for driving long lines to line length. These rule bases are stored in a main memory of the computer system. The computer system is configured to apply the first rule base to the long line to determine whether to divide the long line into two or more segments by inserting repeater amplifiers, and to apply the second rule base to optimize the size of each of the repeater amplifiers. The resulting long line, segmented by size-optimized repeater amplifiers, provides minimal signal-propagation delay.

17 Claims, 10 Drawing Sheets

METHOD OF OPTIMIZING REPEATER PLACEMENT IN LONG LINES OF A COMPLEX INTEGRATED CIRCUIT

CROSS REFERENCE TO A RELATED APPLICATION

The present application is related to the commonly assigned, co-pending U.S. patent application Ser. No. 08/669,897 entitled "Spare Repeater Amplifiers for Long Lines on Complex Integrated Circuits," by Chakra R. Srivatsa and James A. Bauman, filed herewith.

BACKGROUND

1. Field of the Invention The present invention relates, in general, to the design of digital circuits, and more particularly to reducing delay times through relatively long lines in a complex digital integrated circuit (IC).

2. Description of Related Art The speed performance of a complex IC is often limited by the propagation of electrical signals over relatively long conductors, i.e., long lines. Therefore, IC design engineers pay particular attention to reducing the length, and consequently the propagation delay time, of long lines. Nevertheless, the process of routing lines for complex ICs still typically results in a number of relatively long lines that limit the overall speed performance of the IC.

FIG. 1A is a schematic diagram illustrating a portion of a typical IC, which includes a driver amplifier 10 having an output terminal coupled to a load 12 via a long line 14. Load 12 is shown to be an inverter, but could be any of a wide variety of electrical loads, e.g. another type of logic gate, an LED, a resistor, or a relay. Long line 14 is conventionally modeled using a distributed resistance R and a distributed capacitance C. Time delay Tdrvr represents the signal propagation delay from the input terminal of driver amplifier 10 to the input terminal of load 12.

One method of decreasing time delay Tdrvr is to increase the size of driver amplifier 10. Unfortunately, increases in driver-amplifier size do not come without cost. It is well known that to achieve optimum speed and efficiency a series of amplifiers should be "tapered" so that each successive amplifier stage does not represent too large or too small a load for the preceding stage. In other words, each successive amplifier is some constant factor larger that the preceding stage. That factor, conventionally known as a taper factor f, is typically around three, meaning that each successive amplifier stage is three times larger than the preceding stage.

FIG. 1B illustrates the relationship between time delay T drvr (vertical axis) and the size, specified as the gate width, of driver amplifier 10 (horizontal axis). For relatively small gate widths, e.g. less than 50 μm, small changes in driver-amplifier size drastically reduce time delay Tdrvr. However, as driver size increases, e.g. gate widths greater than 150 μm for long line 14, further increases in the size of driver amplifier 10 have relatively little effect on time delay T drvr.

At first glance, it appears that making driver amplifier 10 as large as possible provides the shortest time delay T drvr. However, to maintain a constant taper factor f, each taper-factor increase in the size of driver amplifier 10 requires an additional amplifier stage. For example, given a typical taper factor f of three, an additional amplifier stage must be provided each time the size of driver amplifier 10 is increased by a factor of three. Unfortunately, each additional stage imposes an additional delay period. Therefore, when determining whether increasing driver size will decrease time delay Tdrvr, a design engineer must take into account any delay associated with additional amplifier stages required to maintain the appropriate taper: if the time saved by increasing the size of driver amplifier 10 is less than the delay time imposed by any additional amplifier stage or stages, the size of driver amplifier 10 should not be increased.

Presently, engineers use commercially available software to identify long lines, and then optimize the delay imposed by those lines by e.g. referring to curves such as curve 25 of FIG. 1B and picking a driver size from knee area 30. This time-saving rule of thumb works fine as an approximation. However, as circuits become more complex and timing becomes more critical, such estimates often fail to realize critical speed improvements. Therefore, there exists a need for a method of quickly determining the optimum driver sizes for long lines on an IC.

In addition to optimizing driver size, signal propagation time through a long line may be further reduced in some cases by dividing the long line into two or more segments by inserting repeater amplifiers. Determining how many repeater amplifiers, if any, to insert into a long line is conventionally a trial-and-error process. However, as with choosing an appropriate driver size, more complex circuits demand more precise measurements to realize critical speed improvements. Moreover, the complexity of modern ICs renders conventional trial-and-error methods far too time consuming. Hence, design engineers need a way to rapidly determine the number of repeater amplifiers to insert into a long line to achieve the shortest possible propagation delay.

SUMMARY

The present invention provides a method for rapidly determining the number and size of amplifiers used to drive a long line to achieve the shortest possible signal propagation delay.

According to the inventive method, a design engineer empirically derives two rule bases: the first rule base determines the number of repeater amplifiers, if any, that should be inserted into a line of a given RC time constant to minimize the propagation delay through that line; the second rule base relates optimum amplifier size to the RC time constant of lines of various lengths. These rule bases are stored in a main memory of a general-purpose computer system.

To optimize the signal propagation times through a particular long line of an integrated circuit, the design engineer first loads a digitally represented simulation of the circuit into the main memory of the computer system. Then, using commercially available software, the computer system determines the RC time constant and the signal propagation delay associated with the long line.

Next, the computer system applies the RC time constant to the first rule base to determine whether to divide the long line into two or more segments by inserting repeater amplifiers, or "repeaters," into the long line. For further reductions in signal propagation delay, the second rule base may be applied to each segment of the long line to optimize the size of each amplifier associated with the line. Finally, the computer system determines the signal propagation delay associated with the delay-optimized long line, allowing the design engineer to assess the improvement in signal propagation delay.

DETAILED DESCRIPTION

Figure 1A:
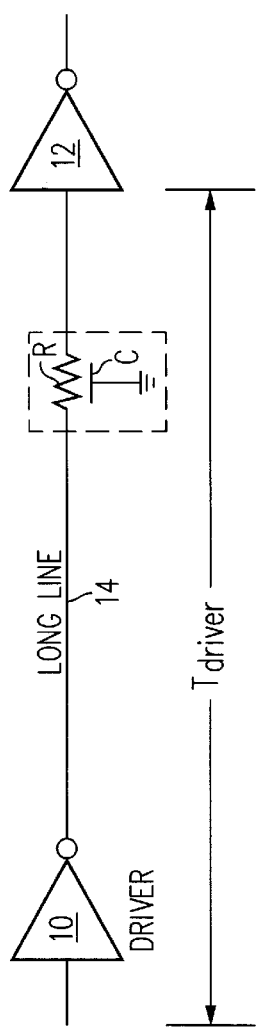
FIG. 1A is a schematic diagram of a portion of a typical integrated circuit.
Figure 1B:
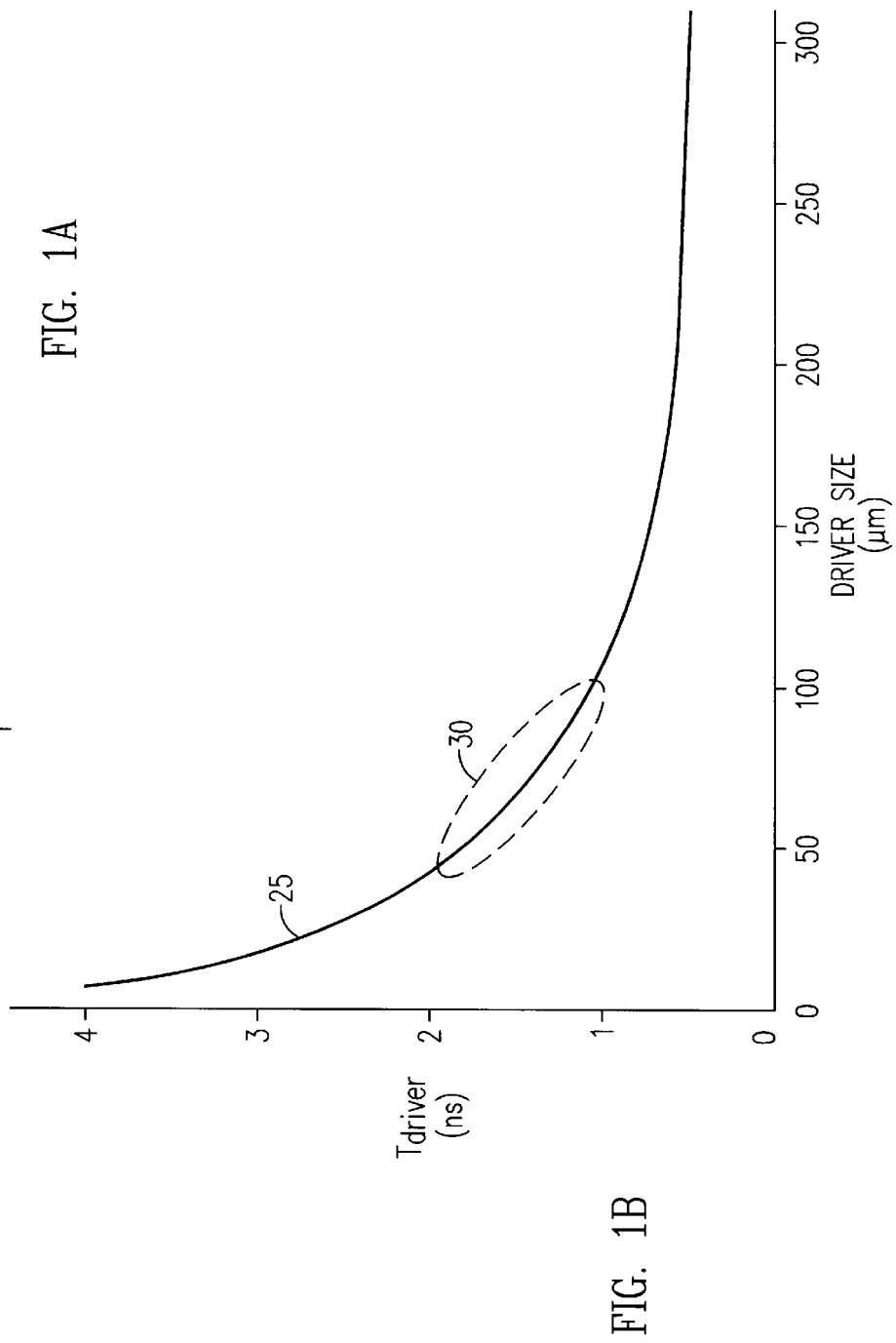
FIG. 1B illustrates the relationship between signal propagation time and the size of a driver amplifier.
Figure 2:
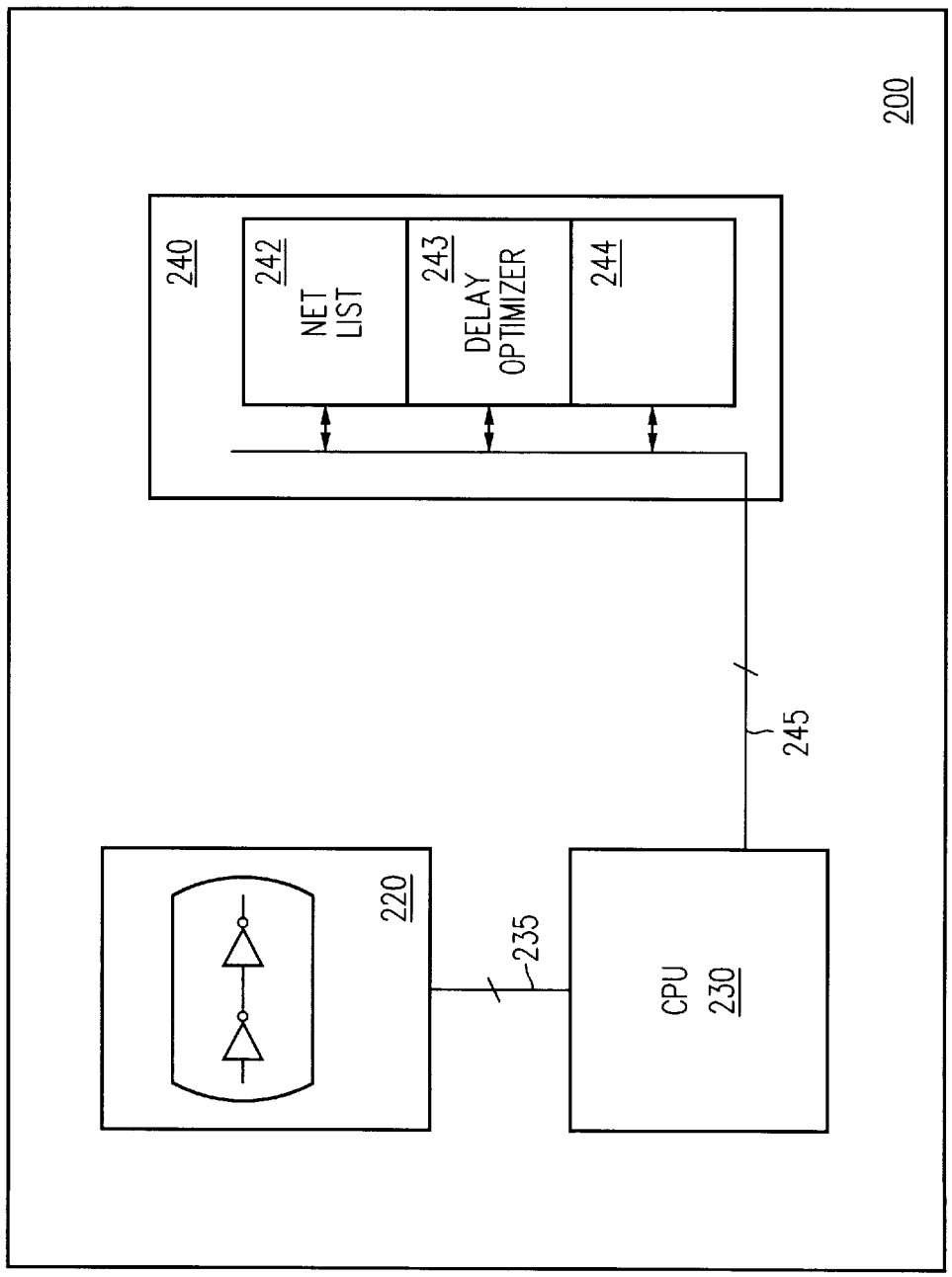
FIG. 2 is a block diagram of a conventional general-purpose computer 200 configured in accordance with the present invention to reduce delay times associated with long lines on ICs.

FIG. 2 is a block diagram of a conventional general-purpose computer 200, including a display 220 coupled to a CPU 230 via a display bus 235, and a main memory 240 coupled to CPU 230 via a memory access bus 245.

In accordance with the present invention, memory region 242 contains a simulated IC, a portion of which is shown displayed by display 220, conventionally represented as a net list. Also in accordance with the present invention, CPU 230 is configured to execute a computer program, stored in memory region 243, that minimizes delay times associated with long lines (i.e., long conductors) specified by the information stored in net list memory region 242. The computer program stored in memory region 243 by CPU 230 is referred to as delay optimizer 243.

Figure 3:
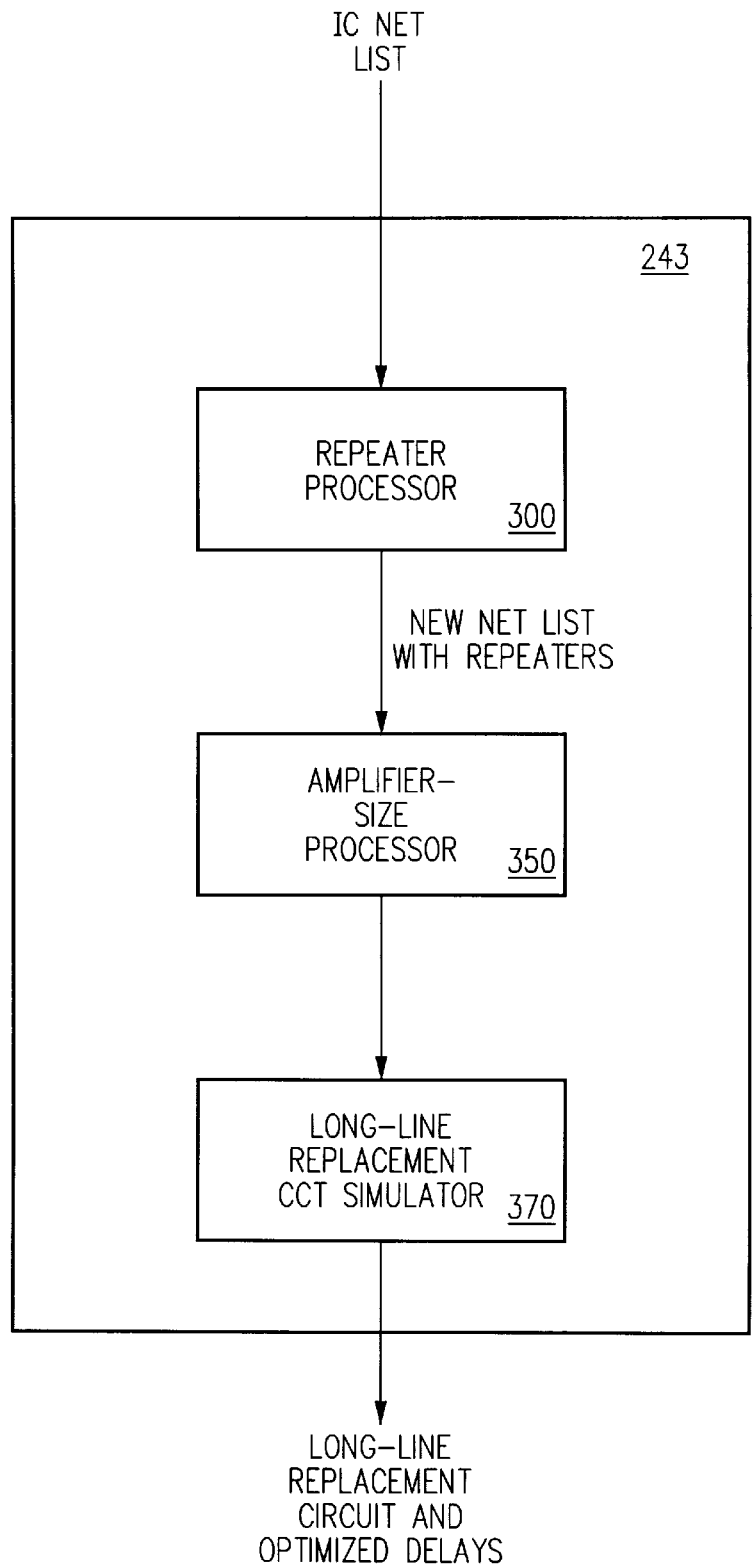
FIG. 3 is an execution flow diagram of the delay optimization program stored in memory region 243.

FIG. 3 is an execution flow diagram for delay optimizer 243. A repeater processor 300 within delay optimizer 243 receives as input the net list from memory region 242. For each line represented in the net list, repeater processor 300 determines the number of repeater amplifiers, if any, that should be inserted into the line to minimize the signal propagation delay through that line. If one or more repeater amplifiers are deemed necessary, repeater processor 300 segments the long line by inserting the new repeater amplifier or amplifiers into the net list. The result of this insertion operation is a new net list that describes the segmented long line. This new net list is then provided to amplifier-size processor 350 within delay optimizer 243.

For purposes of the present invention, a driver amplifier is any amplifier that drives a long line or a segment of a long line. For example, in a line bisected by a single repeater amplifier the repeater amplifier becomes the driver amplifier for the second segment.

In one embodiment of the present invention, amplifier-size processor 350 utilizes a rule base stored in region 244 of memory 240 to select an optimum size for each amplifier driving a segment of the long line. A simulated size-optimized replacement circuit for the long line, which includes the long line segmented by size-optimized repeater amplifiers, is then conveyed to long-line replacement circuit simulator 370.

Replacement circuit simulator 370 updates a log file (not shown) to include the modifications made to the long line, such as the number, placement, and size of inserted repeater amplifiers. Replacement circuit simulator 370 also determines a new time delay associated with the replacement circuit for the long line and updates a delay file stored in memory 240 to include the new time delay. A circuit designer then evaluates the difference between the new delay with the delay associated with the original long line.

Figure 4:
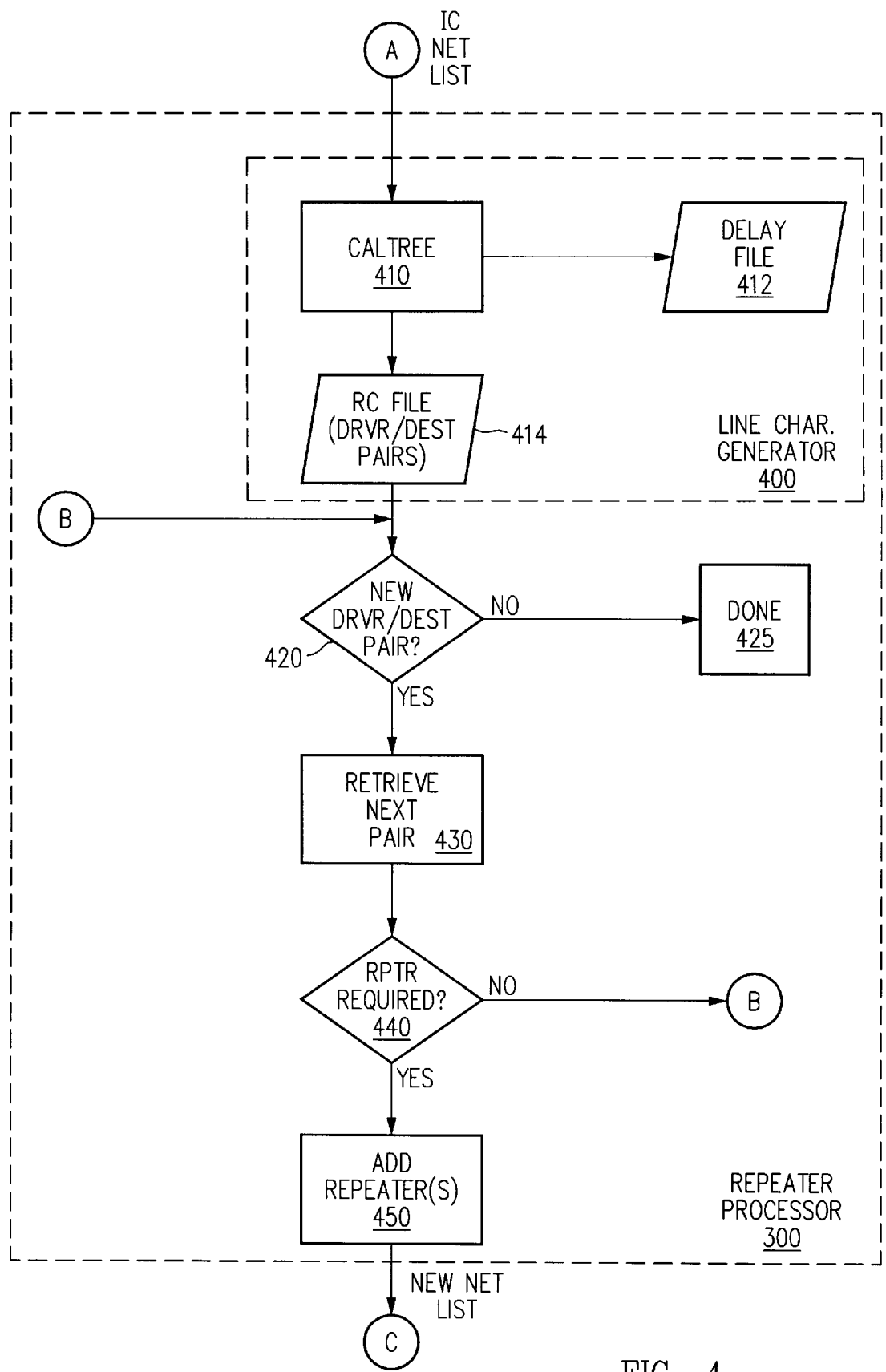
FIG. 4 is a diagram illustrating the process flow for repeater processor 300 of FIG. 3.

FIG. 4 is a diagram illustrating the process flow for repeater processor 300 of FIG. 3. Beginning at start node A, the net list stored in first region 242 of memory 240 is provided as input data to a line characterization generator 400 configured to provide signal-propagation-speed characteristics for each long line of the simulated IC. Examples of signal-propagation-speed characteristics include resistivity, line width, and line spacing. Line characterization generator 400 then uses these characteristics to determine a signal propagation delay time associated with each long line.

In accordance with one embodiment of the invention, characterization generator 400 includes a program Caltree, which is a modified version of a commercially available circuit analysis tool. Computer 200 employs Caltree in caltree operation 410 to execute the well-known Elmore delay method to create a delay file 412 that includes a time delay for each line of the net list. The program Caltree is similar to other conventional programs that use the Elmore delay method, but is modified to create an RC file 414 that includes a list of RC time constants. The list includes one RC time constant for each line, i.e., each driver/destination pair, specified in net list memory region 242. Modifying a conventional Elmore method to provide RC information is simple, as the RC information is necessarily provided in an intermediate step of the conventional Elmore method: a programmer need only create a file to store this RC information and write the RC information to that file. Such modification is well within the ability of those skilled in the art.

Moving on to decision block 420, repeater processor 300 determines whether any RC entries are available for inspection in RC file 414. If RC file 414 is empty, or if all of the RC entries within RC file 414 have been considered, the optimization process is complete and the process flow moves to block 425. Conversely, if there remains an RC entry to consider, i.e., an RC entry corresponding to an additional line, then repeater processor 300 retrieves that RC entry in operation 430.

Recall that the insertion of a repeater amplifier may decrease the delay time associated with a long line; the longer the line, the greater the likelihood that a repeater amplifier decreases the delay.

Moreover, longer line lengths, or lines with relatively high RC time constants, may benefit from the insertion of more than one repeater amplifier. Thus, repeater processor 300 includes a repeaters-required decision 440 that determines whether to insert one or more repeater amplifiers into the line. If no repeater amplifier is required, repeater processor 300 returns to decision block 420 to look for the next RC entry. Conversely, if one or more repeater amplifiers are required, the process continues to add-repeater operation 450.

Add-repeater operation 450 segments the long line by inserting one or more repeaters into net list 242 to create a new net list that replaces the original long line with a segmented long line. The steps carried out in add-repeater operation 450, i.e., selecting the optimum number of repeater amplifiers to insert in a given line, are described below in connection with FIG. 6.

Figure 5:
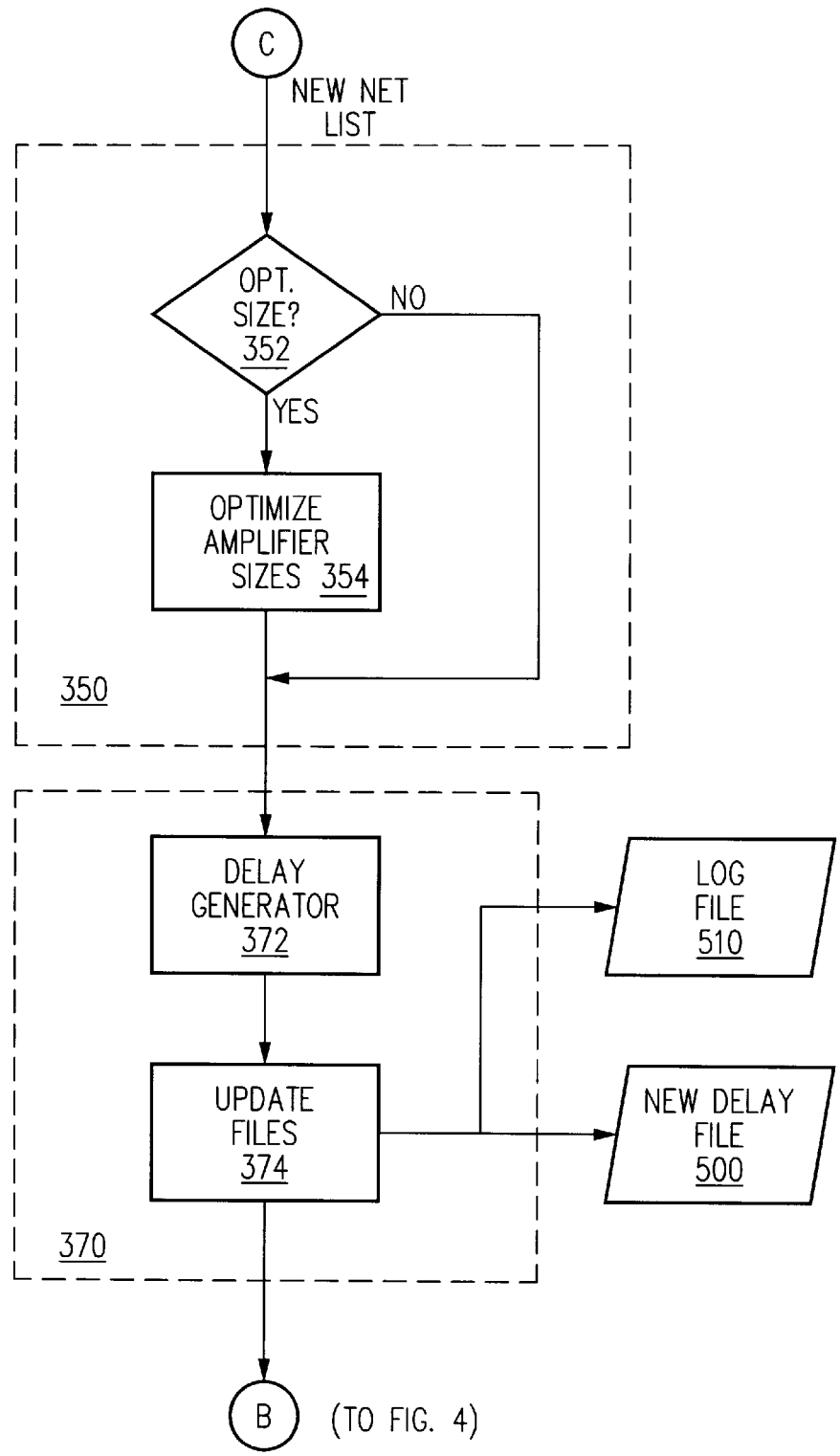
FIG. 5 is a diagram illustrating the process flow for amplifier-size processor 350 of FIG. 3.

FIG. 5 is a diagram illustrating the process flow for amplifier-size processor 350 of FIG. 3. In one embodiment, the amplifiers associated with the new, segmented long-line are not size optimized; instead, a standard repeater amplifier size is selected for each repeater amplifier to be inserted. In another embodiment, each amplifier associated with the new, segmented long line is size optimized. This choice of options is illustrated in FIG. 5 as repeater optimization check 352. If standard-sized repeater amplifiers are to be inserted, the process flow moves from check 352 directly to long-line replacement circuit simulator 370. If, on the other hand, the repeater amplifiers (and the driver) are to be size optimized, the process flow moves to optimize-amplifier-sizes operation 354 in which the amplifier size is selected to provide the shortest time delay. Operation 354 is described below in detail in connection with FIGS. 7–9.

In one embodiment, repeaters-required decision 440 compares the time delay of the long line with a predefined time delay. If the time delay of the long line is greater than the predefined time delay, repeaters-required decision is true and otherwise false. The specification of the time delay for this decision can be specified in several ways. In one embodiment, the length of the long line is used on decision 440, i.e., if the length of the long line is greater than a predefined length, decision 440 is true. Alternately, the RC time constant of the long line could be used. One method for selecting the predefined length is described below.

Figure 6:
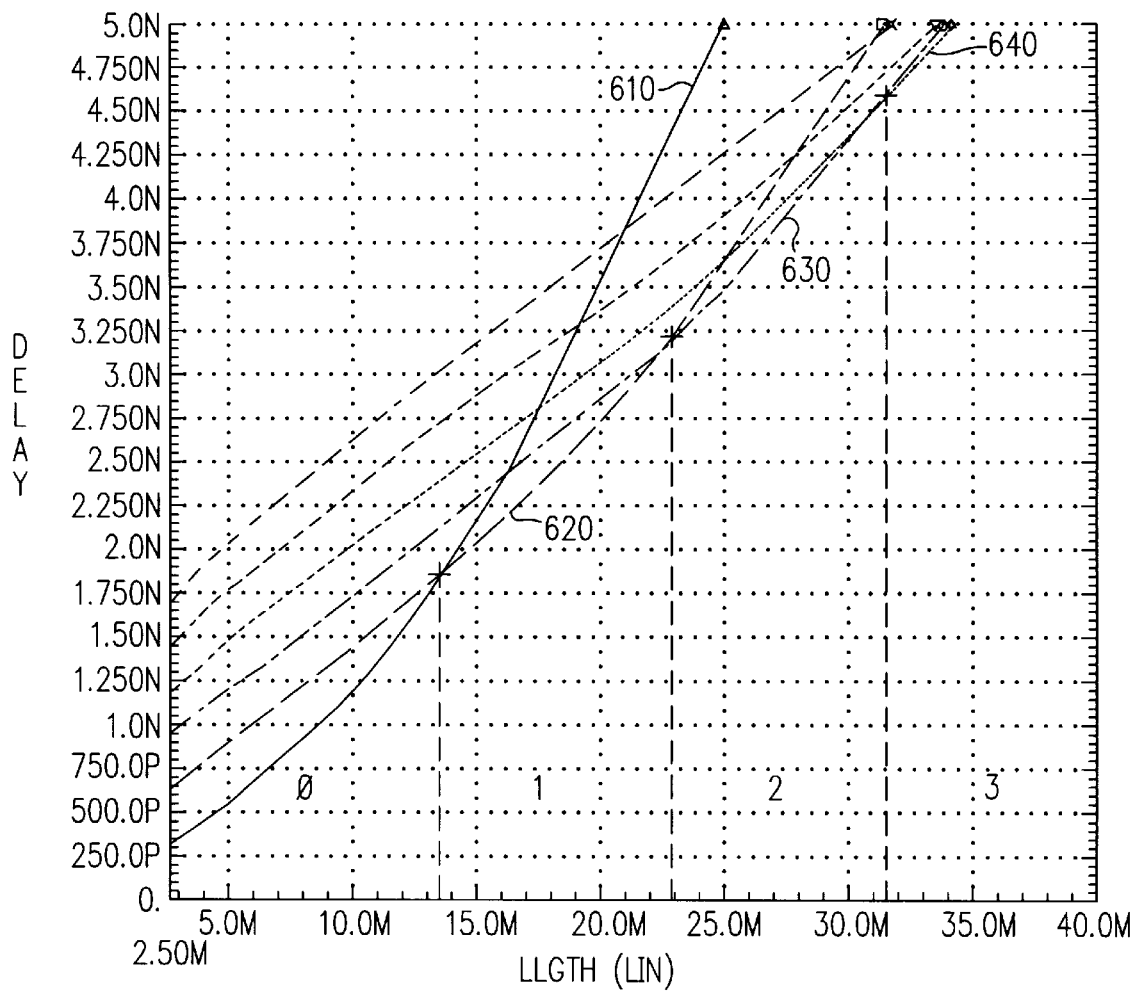
FIG. 6 illustrates how repeater processor 300 determines how many, if any, repeater amplifiers to insert into a given long line to optimize the time delay through that line.

FIG. 6 illustrates how, in repeaters-required decision 440, repeater processor 300 determines how many, if any, repeater amplifiers to insert into a given long line to optimize the time delay through that line. FIG. 6 shows a graph of delay (vertical axis) versus line length (horizontal axis) for long lines having 0, 1, 2, and 3 repeater amplifiers, each repeater amplifier driving a segment of an equally divided long line. Curve 610 represents signal propagation delay time versus line length for a line with no (i.e., zero) repeater amplifiers, curve 620 represents delay time versus line length for a line bisected by one repeater amplifier, curve 630 represents delay time versus line length for a long line divided into three equal segments by two repeater amplifiers, and curve 640 represents delay time versus line length for a long line divided into four equal segments by three repeater amplifiers. In one embodiment, the associated amplifiers are each optimized in accordance with the amplifier-size-optimization method described below in connection with FIGS. 7–9.

As shown in FIG. 6, for lines of less than approximately 13.5 mm, the shortest delay time results when no repeater amplifiers are used. For lines of from approximately 13.5 mm to 22.7 mm in length, a single repeater amplifier results in the shortest delay. For lines between approximately 23 mm and 31 mm, two repeater amplifiers is optimum. Finally, lines above approximately 31 mm are optimized with three repeater amplifiers. The lines of FIG. 6 are of similar width, resistivity, and spacing. Were they not, a more general model could be empirically derived using an X-axis parameter of e.g. RC time constant instead of length.

The cross-over points, identified in FIG. 6 by plus signs (+), may be used e.g. to generate a transform that provides the optimum number of repeater amplifiers for a given line length. More general transforms could similarly be derived that express the optimum number of repeater amplifiers for a line of a given RC time constant. In one embodiment, the crossover points are stored in a conventional look-up table (LUT) in memory regions 244 of memory 240 so that CPU 230, when executing the delay optimization process stored in memory region 243, can look up the appropriate number of repeater amplifiers for a given line length.

If the aforementioned operation of repeaters-required decision 440 reveals a need for one or more repeater amplifiers in a given line, the process flow continues to add-repeater operation 450, during which computer 200 creates a new net list for that line. The new net list is a conventional representation of the line segmented into a number of shorter lines by the repeater amplifiers.

As discussed above in connection with FIG. 5, if the amplifiers added to the new net list are to be size optimized, repeater optimization check 352 passes the process flow to optimize-amplifier-sizes operation 354. In one embodiment, amplifier-size processor 350 relies on an amplifier-size rule base stored as a LUT in region 244 of memory 240 to select an optimum size for each amplifier associated with the segmented line (i.e., each amplifier driving a segment of the line). The development of the amplifier-size rule base is described below in connection with FIGS. 7–9.

Figure 7A:
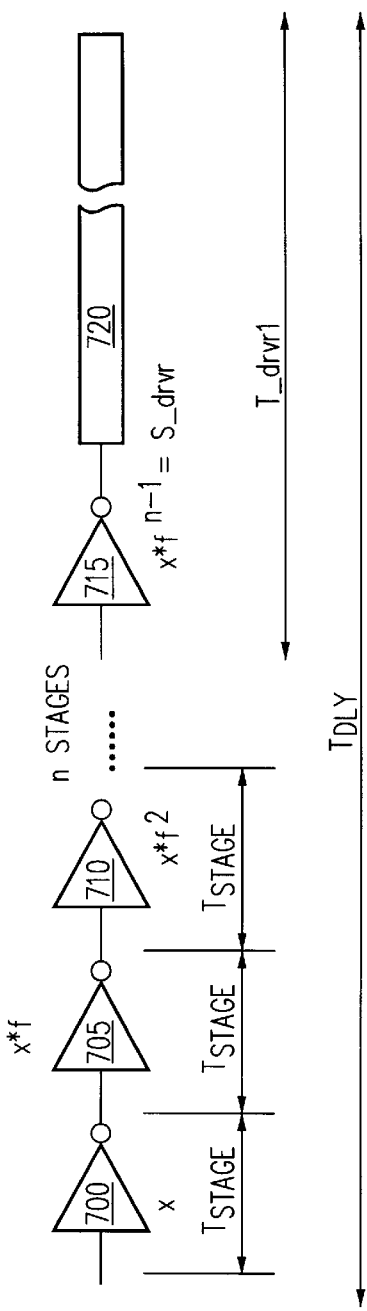
FIG. 7A is a schematic diagram of a chain of n inverters connected to one end of a long line 720.

FIG. 7A is a schematic diagram of a chain of n inverters, including inverters 700, 705, 710, and 715, coupled to one end of a long line 720. The chain of inverters has a constant taper factor f, so that each successive inverter is increased in size by the taper factor f, and so that each stage has the same delay period Tstage. Recalling that, for purposes of the present invention, a driver amplifier is any amplifier that drives a long line or a segment of a long line, final inverter 715 is a driver amplifier.

Taper factor f conventionally refers to the size relationship between stages. For example, each subsequent inverter stage has a gate width that is one taper factor f times the gate width of the preceding stage. In the example of FIG. 7A, the first inverter 700 is of a size equal to some value x. The next inverter 705 has a gate width of f times x, or fx. Similarly, inverter 710 is f times larger than inverter 705, or f squared times the size of inverter 700 ($f^2 x$). Thus, as shown in FIG. 7A, for an n-stage chain of inverters, the size of driver 715, i.e., Sdrvr, is equal to the size of the first stage, inverter 700, times the taper factor f to the n-1 power.

The delay period to be optimized is the total signal delay time Tdly from the input node of inverter 700 to the end of long line 720. This total signal delay time Tdly is the sum of the individual delays of each stage in the inverter chain combined with delay associated with the driver amplifier. In the example of FIG. 7A, the driver delay is driver delay T drvr1 associated with inverter 715. Stated mathematically, the relationship is:

$$T\_dly = T\_drvr1 + (n)T\text{stage}$$

Figure 7B:
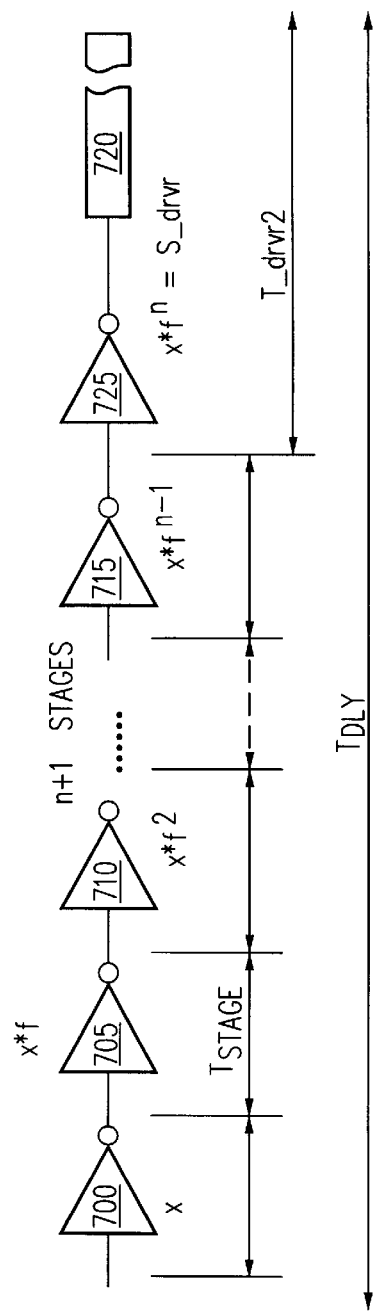
FIG. 7B is a schematic diagram of the chain of n+1 inverters connected to one end of a long line 720.

FIG. 7B is a schematic diagram that includes inverters 700, 705, 710, and 715 of FIG. 7A and an additional inverter 725 that serves as the driver amplifier in place of inverter 715. In FIG. 7B, driver size Sdrvr is increased by a taper factor f. Unfortunately, maintaining the proper taper for the chain of amplifiers requires an additional stage (e.g., inverter 725) be added to the chain of inverters. Because the chain of inverters includes n+1 stages, the reduction of delay associated with the increased driver size Sdrvr is offset by a stage delay Tstage (typically 200ps). Thus, if the decrease in the driver delay from Tdrvr1 to Tdrvr2 is less than stage delay Tstage, signal delay time Tdly increases with the addition of inverter 725. Conversely, if the difference between Tdrvr1 and Tdrvr2 is greater than stage delay Tstage, signal delay time Tdly decreases with the addition of inverter 725.

Figure 8:
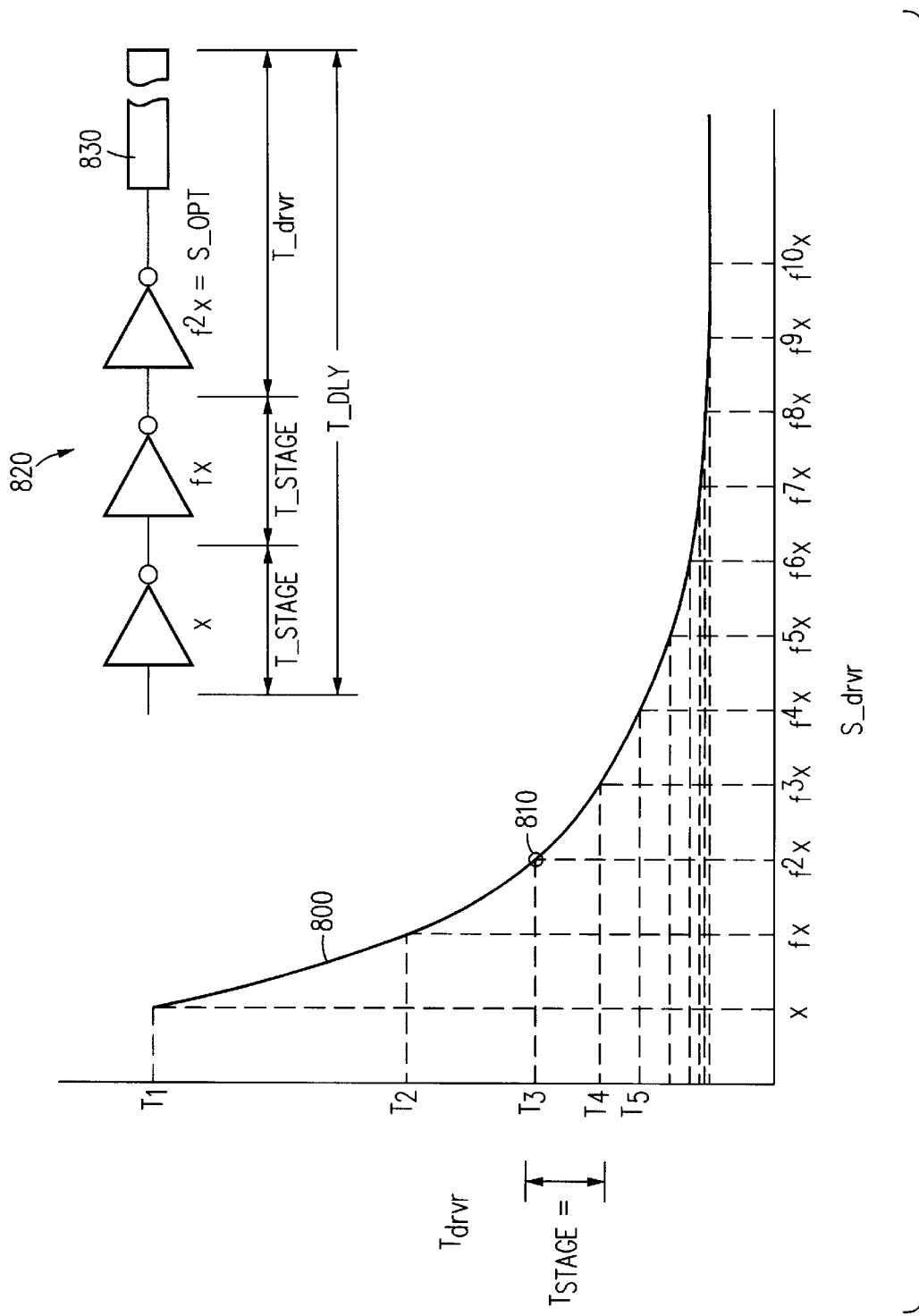
FIG. 8 illustrates the process of selecting an optimum driver size in accordance with the present invention.

FIG. 8 illustrates the procedure of selecting an optimum driver size Sopt in accordance with the present invention. A curve 800 shows the relationship between driver delay T drvr and driver size Sdrvr for a long line of a given length. In accordance with the present invention, driver delay T1 is first established, using CPU 230 configured with commercially available software (e.g., HSPICE) for a driver of the smallest size w. Then, driver delay T2 is similarly established for the same long line but with driver size Sdrvr increased by one taper factor f. If the improvement in the delay (T1–T2), is greater than stage delay Tstage, CPU 230 simulates an additional one-taper-factor increase in driver size Sdrvr. Once again, CPU 230 compares the decrease in driver delay Tdrvr associated with increasing the driver size (T2–T3) to stage delay Tstage, the time cost associated with adding a stage.

As shown in FIG. 8, the addition of a second driver of size $f^2x$ improves driver delay Tdrvr (from T2 to T3) by an amount greater than stage delay Tstage. Consequently, CPU 230 simulates a further increase in driver size Sdrvr to $f^3x$. This time, however, the resulting improvement in driver delay Tdrvr (i.e., T3 –T4) is less then the additional time delay Tstage associated with an additional stage. Expressed mathematically, (T3–T4)<Tstage. Having found the driver size Sdrvr that, if increased by a taper factor f, provides a longer signal delay time Tdly, computer 200 concludes that the optimum driver size Sopt for the given line length is $f^2x$, as indicated by a circle 810. The optimized driver circuit is shown in FIG. 4 as inverter chain 820, which is shown connected to a long line 830.

Length is not the only characteristic of a line that determines signal propagation time: other parameters, such as width, resistivity, and spacing also play important roles. For this reason, driver size can be directly related to line length only when the other important characteristics of a line are known. For example, the curves of FIG. 5 represent lines of similar width, spacing, and resistivity. If a design engineer is working with lines of differing width, spacing, etc., another method relates the RC time constant of a given line to signal propagation time.

Figure 9:
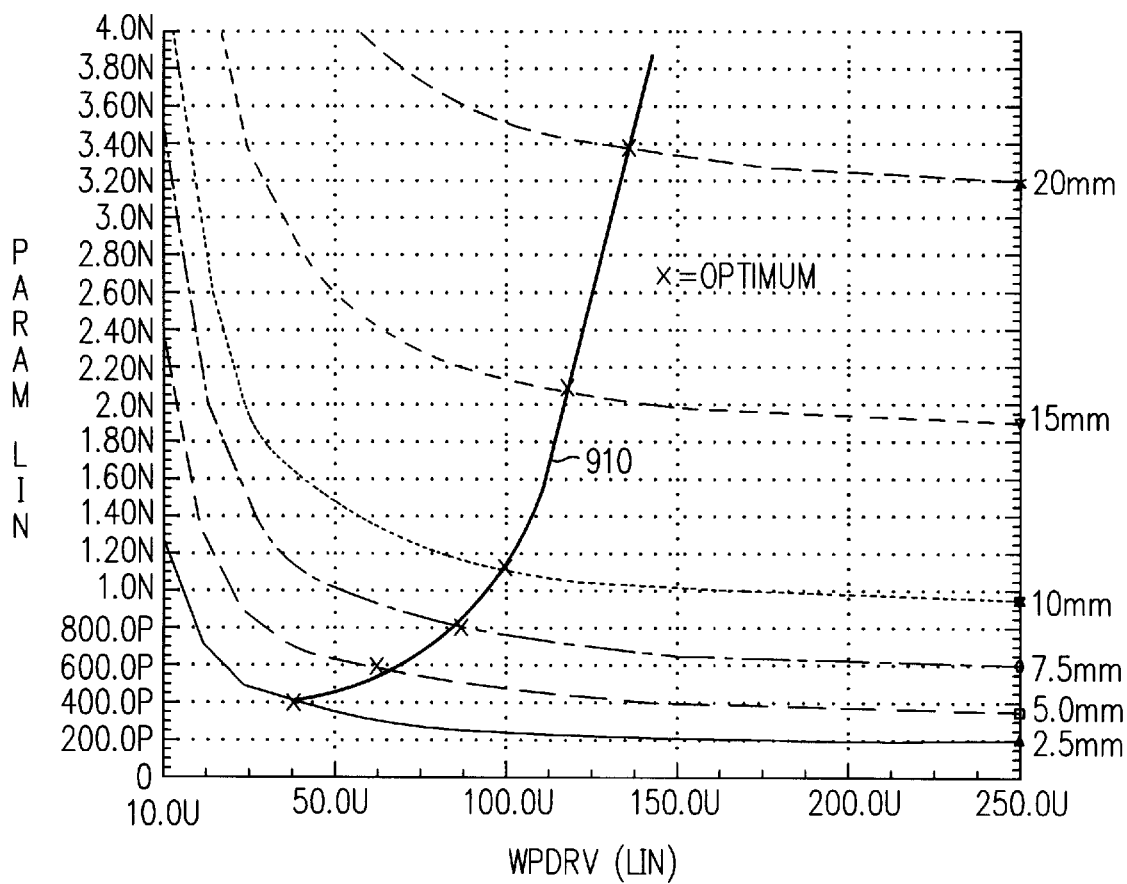
FIG. 9 is similar to FIG. 4, but shows the optimum driver size for six different line lengths.

FIG. 9 is similar to FIG. 4, but shows the optimum driver size Sopt for six different line lengths, 2.5 mm, 5.0 mm, 7.5 mm, 10 mm, 15 mm, and 20mm, where each line is of similar width and resistivity. The curves corresponding to the various line lengths were developed using a version of the HSPICE circuit analysis program available from Meta-Software of Campbell, Calif. Each of the points marked with an X corresponds to the optimum driver size Sdrvr for a given line length, as derived using e.g. the method described in connection with FIG. 8.

Once the optimum driver size Sopt is known for a number of line lengths, conventional curve fitting techniques are used to derive a transform from driver size to line length. This transform is illustrated in FIG. 9 as a curve 910, and may be expressed approximately as 43 $\mu$+4.7($\mu$/mm)×L, where L is line length. For a given line, optimum driver size Sopt is obtained using this transformation.

In one embodiment, line lengths and corresponding driver sizes are stored in a conventional LUT in memory regions 244 of memory 240. In operation 354, CPU 230, executing the delay optimization program stored in memory region 243, looks up the appropriate sizes for repeater amplifiers in the new net list based upon the length of the line segments to be driven by each repeater amplifier. The repeater amplifiers of the new net list are then modified to be of optimum driver size Sdrvr.

Referring back to FIG. 5, amplifier-size processor 350 provides the new net list, including any additional repeater amplifiers, to long-line replacement circuit simulator 370. Within circuit simulator 370, a delay generator operation 372 generates a value corresponding to the delay associated with the new, delay-optimized long line. In one embodiment, this delay generation is accomplished by summing the signal propagation delays for each segment of the long line. Each signal propagation delay is determined using a LUT that relates signal propagation delay to driver size Sdrvr, destination load, the RC time constant of the line segment, and branch load information for multiple-branch lines (i.e., for lines with more than one destination).

In update-files operation 374, computer 200 updates a delay file 500 with the new delay associated with the delay-optimized long line specified by the new net list. Once new delay file 500 and log file 510 are updated, the process flow returns to decision block 420 of FIG. 4, in which computer 200 checks to see if any RC entries in RC file 414 are yet to be considered.

Once each RC entry in RC file 414 has been inspected and, where necessary, optimized through the use of repeater amplifiers, each new delay entry in delay file 500 may be compared with a corresponding entry in delay file 412 of FIG. 4 to determine how much, if any, the delay associated with a given long line is reduced by the introduction of one or more repeater amplifiers. Improvements in the delay time may be considered against e.g. any increase in circuit complexity or power consumption.

Figure 10A:
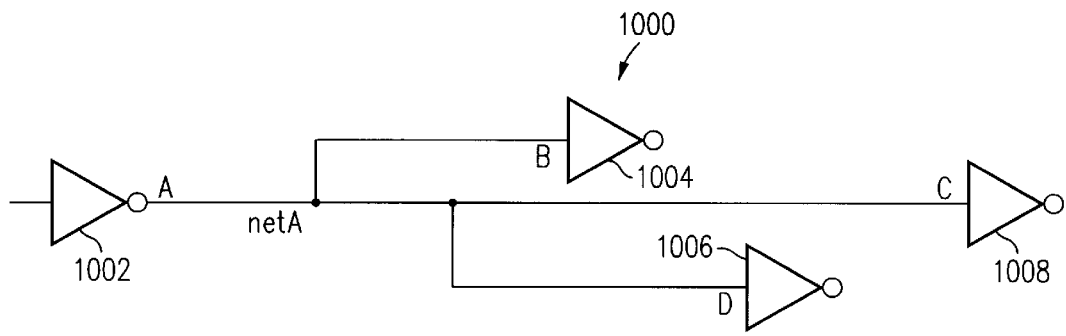
FIGS. 10A, 10B, and 10C are schematic diagrams of a multiple-branch network 1000, which is used to illustrate the inventive delay optimization operation for multiple-branch networks.
Figure 10B:
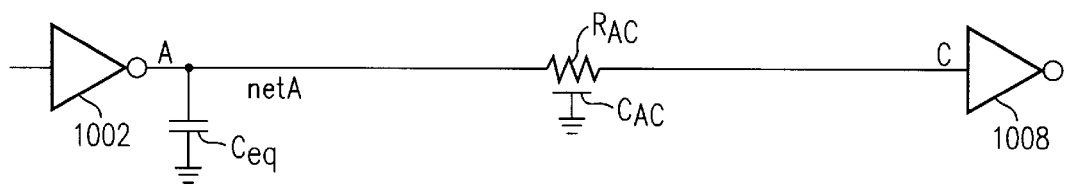
Figure 10C:
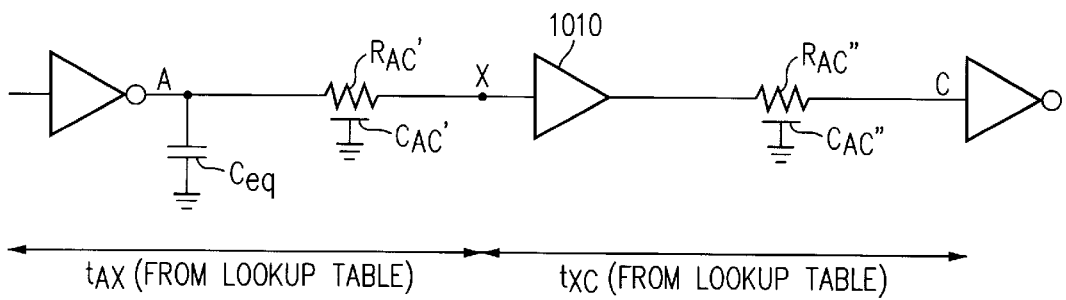

FIGS. 10A, 10B, and 10C are schematic diagrams of a multiple-branch network 1000, and are used to illustrate delay optimization for multiple-branch networks. Network 1000 includes a driver amplifier 1002 connected to destination loads 1004, 1006, and 1008.

Recall from the discussion of FIG. 4 that RC file 414 includes RC information for each line of the circuit stored as a net list in memory region 242. For multiple-destination lines such as netA of FIG. 10A, caltree operation 410 determines the resistance R and the capacitance C for each source-destination pair (A to B, A to C, and A to D) and stores them in RC file 714 as RAB, CAB, RAC, CAC, R AD, and CAD.

FIGS. 10B and 10C illustrate the operation of optimizing a long line defined by the source-destination pair A–C. Line characterization generator 400 adds capacitances CAB and CAD associated with source-destination pairs A–B and A–D, respectively, to form an equivalent capacitance Ceq. Line characterization generator 400 then conventionally models source-destination pair A–C, as shown in FIG. 10B, using equivalent capacitance Ceq, a distributed resistance R AC, and a distributed capacitance CAC.

Repeater processor 300 determines the requisite number of repeater amplifiers to be inserted into source-destination pair A–C based on the values of distributed resistance R AC and a distributed capacitance CAC. Then, in add-repeater operation 450, repeater processor 300 inserts the requisite repeater amplifiers, e.g., repeater amplifier 1010 of FIG. 10, into source-destination pair A–B. In the example of FIG. 10C, repeater amplifier 1010 divides source-destination pair A–C into two segments of approximately equal length, A–X and X–C.

Next, segment A–X is conventionally modeled using a distributed resistance RAC' and a distributed capacitance C AC', and segment X–C is conventionally modeled using a distributed resistance RAC" and a distributed capacitance C AC". Delay generator operation 372 then determines the new total delay TAC'as the delay tAX associated with segment A–X and the delay tXC associated with repeater amplifier 1010 and the segment X–C.

The above description is illustrative and not limiting. Further modifications of the above-described invention will be apparent to those skilled in the art. For example, while the foregoing descriptions show repeater amplifiers and drivers as inverters, the present invention is equally applicable to non-inverting amplifiers. Such variations fall within the scope of the appended claims.

What is claimed is:

1. A method of operating a general-purpose computer system to minimize a time delay required for a signal to propagate between a first node and a second node of an integrated circuit, wherein a simulation of the integrated circuit is stored as circuit data in a first region of memory in the computer system, the method comprising:

analyzing the circuit data in the first region of memory to obtain signal-propagation-speed characteristics for a conductor connected between the first and second nodes;

generating a first simulated time delay representing a time required for the signal to propagate between the first and second nodes over said conductor;

deciding, based on the signal-propagation-speed characteristics of the conductor, whether separating the conductor into line segments, each of the line segments being separated from another of the line segments by a repeater amplifier, decreases the time required for the signal to propagate between the first and second nodes; and indicating how many of the line segments are required to minimize the time delay required for said signal to propagate between said first node and said second node if separating the conductor into the plurality of segments decreases the time required for the signal to propagate between the first and second nodes.

2. The method of claim 1, wherein the signal-propagation-speed characteristics include resistance and capacitance.

3. The method of claim 1, wherein the signal-propagation-speed characteristics include a length of the conductor.

4. The method of claim 1, further comprising generating an optimum size of the repeater amplifier.

5. The method of claim 4, wherein the repeater amplifier includes an amplifier stage having a delay period, and wherein said generating the optimum size of the repeater amplifier comprises:

generating a first delay period associated with fabricating the amplifier of a first size X; generating a second delay period associated with fabricating the amplifier of a second size fx where f is a taper factor;

providing a delay difference by subtracting the second delay period from the first delay period; and comparing the delay difference with the delay period.

6. The method of claim 1, wherein the integrated circuit includes a third node connected to the first and second nodes via a second conductor, the first-mentioned conductor and the second conductor forming first and second signal paths between the first and second nodes and the first and third nodes, respectively, and wherein the signal-propagation-speed characteristics of the first conductor are determined in part by signal-propagation-speed characteristics of the second conductor.

7. The method of claim 6, wherein the signal-propagation-speed characteristics of the second conductor include a capacitance value corresponding to the second conductor.

8. The method of claim 6, further comprising displaying the second simulated time delay.

9. The method of claim 1, wherein each of the segments has an associated segment delay time, the method further comprising generating a second simulated time delay between the first and second nodes, the second simulated time delay being a sum of the segment delay times.

10. A method of operating a general-purpose computer system to minimize a simulated time delay required for a signal to propagate between a first node and a second node on a simulated circuit stored as circuit data in a first region of a memory in the computer system, the method comprising:

creating a first rule base for determining an optimum number of segments in which to divide a conductor connected between the first and second nodes;

creating a second rule base for determining an optimum driver size for the conductor;

storing the first rule base in a second region of the memory and the second rule base in a third region of the memory;

analyzing the circuit data in the first region of the memory to generate an RC time constant of the conductor;

generating a signal-propagation delay associated with the conductor;

deciding, using the RC time constant and the first rule base, whether to separate the conductor into a plurality of line segments, wherein each line segment in said plurality of line segments is separated from another line segment in said plurality of line segments by a repeater amplifier;

indicating how many of the line segments are required to minimize the time delay required for said signal to propagate between said first node and said second node if separating the conductor into the plurality of line segments decreases the time required for the signal to propagate between the first and second nodes; and generating an optimum size for each repeater amplifier using the first rule base.

11. The method of claim 10, wherein each repeater amplifier has a stage delay period, and wherein optimizing the size of the repeater amplifier comprises:

generating a first delay period associated with fabricating the amplifier of a first size X;

generating a second delay period associated with fabricating the amplifier of a second size fx where f is a taper factor;

providing a delay difference by subtracting the second delay period from the first delay period; and comparing the delay difference with the stage delay period.

12. The method of claim 10, wherein the integrated circuit includes a third node connected to the first and second node via a second conductor, the first-mentioned conductor and the second conductor forming first and second signal paths between the first and second nodes and the first and third nodes, respectively, the method further comprising:

analyzing the circuit data in the first region of memory to determine a capacitance of the second signal path;

representing the second signal path as a lumped capacitance connected to the first node;

simulating a repeater amplifier inserted at a point in the first signal path, the repeater amplifier dividing the first signal path into first and second signal-path segments; and generating the respective time delays associated with the first and second signal-path segments and the simulated repeater amplifier;

wherein a new simulated time delay is the sum of the respective time delays associated with the first and second signal-path segments and the simulated repeater amplifier.

13. The method of claim 12, wherein the point is a midpoint of the first signal path.

14. The method of claim 13, wherein the midpoint divides the first signal path such that the first and second signal-path segments have approximately equal second and third RC time constants.

15. The method of claim 12, wherein the new simulated time delay is generated using a look-up table configured to relate signal propagation delay to amplifier and line segment characteristics.

16. The method of claim 10, wherein the second rule base is stored as a look-up table.

17. The method of claim 10, wherein the first rule base is stored as a look-up table.

* * * * *